(12) United States Patent
Jan et al.

(10) Patent No.: US 10,707,076 B2
(45) Date of Patent: Jul. 7, 2020

(54) NANOSTRUCTURE COMPOSITE MATERIAL AND MANUFACTURING METHOD THEREOF

(71) Applicant: Institute of Nuclear Energy Research, Atomic Energy Council, Executive Yuan, R.O.C, Taoyuan (TW)

(72) Inventors: Der-Jun Jan, Taoyuan (TW); Shih-Shou Lo, Taoyuan (TW); Cheng-How Wang, Taoyuan (TW)

(73) Assignee: INSTITUTE OF NUCLEAR ENERGY RESEARCH, ATOMIC ENERGY COUNCIL, EXECUTIVE YUAN, R.O.C, Taoyuan (TW)

( * ) Notice: Subject to any disclaimer, the term of this patent is extended or adjusted under 35 U.S.C. 154(b) by 123 days.

(21) Appl. No.: 15/879,608

(22) Filed: Jan. 25, 2018

(65) Prior Publication Data

US 2019/0122886 A1 Apr. 25, 2019

(30) Foreign Application Priority Data

Oct. 20, 2017 (TW) .............................. 106136217 A

(51) Int. Cl.
*H01L 21/02* (2006.01)
*B82Y 30/00* (2011.01)
*H01L 35/16* (2006.01)
*B82Y 40/00* (2011.01)
*H01L 35/26* (2006.01)

(52) U.S. Cl.
CPC ........ *H01L 21/02606* (2013.01); *B82Y 30/00* (2013.01); *H01L 21/02172* (2013.01); *H01L 21/02554* (2013.01); *H01L 21/02603* (2013.01); *H01L 21/02628* (2013.01); *H01L 21/02645* (2013.01); *H01L 35/16* (2013.01); *H01L 35/26* (2013.01); *B82Y 40/00* (2013.01); *H01L 21/02664* (2013.01)

(58) Field of Classification Search
CPC ......... H01L 21/02645; H01L 21/02554; H01L 21/02628; H01L 21/02172; H01L 21/02664; H01L 21/02606; H01L 35/26; H01L 35/16; H01L 21/02603; B82Y 40/00; B82Y 30/00
See application file for complete search history.

(56) References Cited

U.S. PATENT DOCUMENTS

| | | | | |
|---|---|---|---|---|
| 2005/0045876 | A1* | 3/2005 | Fukui | H01L 51/0007 257/40 |
| 2006/0145157 | A1* | 7/2006 | Choi | G02F 1/13458 257/66 |
| 2011/0163307 | A1* | 7/2011 | Lin | H01L 21/02422 257/43 |
| 2013/0153860 | A1* | 6/2013 | Kim | H01L 51/0002 257/14 |

\* cited by examiner

*Primary Examiner* — Francisco W Tschen
(74) *Attorney, Agent, or Firm* — Locke Lord LLP; Tim Tingkang Xia, Esq.

(57) ABSTRACT

A method for manufacturing a nanostructure composite material includes a step of preparing an inorganic material nanostructure, and a step of embedding an organic material to the inorganic material nanostructure so as to form the nanostructure composite material. In addition, a nanostructure composite material is also provided.

7 Claims, 4 Drawing Sheets

S100

S110 — Prepare an inorganic nanostructure

S120 — Embed an organic material to the inorganic nanostructure so as to form a nanostructure composite material

FIG. 1

NANOSTRUCTURE COMPOSITE MATERIAL AND MANUFACTURING METHOD THEREOF

This application claims the benefit of Taiwan Patent Application Serial No. 106136217, filed Oct. 20, 2017, the subject matter of which is incorporated herein by reference.

BACKGROUND OF THE INVENTION

(1) Field of the Invention

The invention relates to a composite material, and more particularly to a nanostructure composite material and a method for manufacturing the nanostructure composite material that can enhance thermoelectric properties effective.

(2) Description of the Prior Art

Thermoelectric materials enable direct energy conversion between heat and electricity by utilizing internal electron flows, not by any mechanical resort. Namely, the thermoelectric materials are capable of generating electricity and removing heat. Thus, the thermoelectric materials are widely applied to recover waste heat and/or in the field of refrigeration and air conditioning.

In practical energy application, only 40% of the energy are actually used for functions, and the rest 60% thereof are dissipated into the atmosphere in a form of waste heat. Hopefully, thermoelectric components can be used to converse the waste heat into electricity. Thus, both energy consumption and environment burden can be reduced. Thereto, a topic of providing a material that can effectively promote thermoelectric properties is definitely urgent to the skill in the art.

SUMMARY OF THE INVENTION

Accordingly, it is an object of the present invention to provide a nanostructure composite material and a method for manufacturing the nanostructure composite material, by which the thermoelectric properties can be enhanced and the volume can be light and thin, and that can be applicable to various wearable devices.

In one embodiment of the present invention, the method for manufacturing a nanostructure composite material includes a step of preparing an inorganic nanostructure, and a step of embedding an organic material to the inorganic nanostructure son as to form a nanostructure composite material.

In one embodiment of the present invention, the nanostructure composite material includes an inorganic nanostructure and an organic material embedded to the inorganic nanostructure so as to form a nanostructure composite material.

In one exemplary embodiment of the present invention, the inorganic nanostructure includes a plurality of nanocolumns.

In one exemplary embodiment of the present invention, the inorganic nanostructure includes a plurality of nanotubes.

In one exemplary embodiment of the present invention, the inorganic nanostructure includes a plurality of nanoneedles.

In one exemplary embodiment of the present invention, the inorganic nanostructure is a Zinc oxide nanostructure, and the step of preparing the inorganic nanostructure includes a step of preparing a Zinc oxide (ZnO) seed solution, a step of coating the Zinc oxide (ZnO) seed solution onto a substrate so as to form a Zinc oxide (ZnO) seed layer, and a step of placing the Zinc oxide (ZnO) seed layer into a growth liquid so as to grow the Zinc oxide (ZnO) seed layer into the Zinc oxide nanostructure.

In one exemplary embodiment of the present invention, the step of preparing the Zinc oxide (ZnO) seed solution includes a step of mixing a Zinc acetate, a diethylene glycol and a deionized water to form a mixture, a step of stirring and heating the mixture so as to form a base solution, and a step of processing the base solution in a centrifugal manner so as to obtain a suspension solution from an upper layer of the base solution, the suspension solution being the Zinc oxide (ZnO) seed solution.

In one exemplary embodiment of the present invention, the step of growing the Zinc oxide (ZnO) seed layer into the Zinc oxide nanostructure includes a heating process and a cleaning process.

In one exemplary embodiment of the present invention, the growth liquid is prepared by mixing a Zinc nitrate, a hexamethy lenetetramie (HMT) and a deionized water.

In one exemplary embodiment of the present invention, the step of embedding the organic material to the inorganic nanostructure includes a step of mixing an organic compound and an organic solvent to form an organic mixture, and a step of placing the inorganic nanostructure into the organic mixture, so that the organic mixture is embedded to the inorganic nanostructure so as to form the nanostructure composite material, wherein the inorganic nanostructure includes Zinc oxide, PbTe, PbSnTe, PbAgTe and narrow band gap thermoelectric materials.

As described above, by providing the nanostructure composite material and the method for manufacturing the same in accordance with the present invention, the composite material includes an inorganic nanostructure and an organic material. The nanostructure composite material with both organic and inorganic properties is manufactured by embedding the organic material to the inorganic nanostructure in a form of nanocolumns, nanotubes or nanoneedles. By implementing a lower thermal conductivity contributed by the embedded organic material, the thermoelectric properties of the nanostructure composite material can thus be enhanced.

In addition, the nanostructure composite material of this present invention is not prepared by layered piling up, thus the entire volume of the nanostructure composite material can be reduced, such that a light and thin composite material can be obtained. Thereupon, the thermoelectric properties of the nanostructure composite material under a low-temperature (below 600K) application environment can ensured.

All these objects are achieved by the nanostructure composite material and the method for manufacturing the nanostructure composite material described below.

BRIEF DESCRIPTION OF THE DRAWINGS

The present invention will now be specified with reference to its preferred embodiment illustrated in the drawings, in which:

FIG. 1 is a schematic view of a preferred method for manufacturing a nanostructure composite material in accordance with the present invention;

DESCRIPTION OF THE PREFERRED EMBODIMENT

Figure 2A:
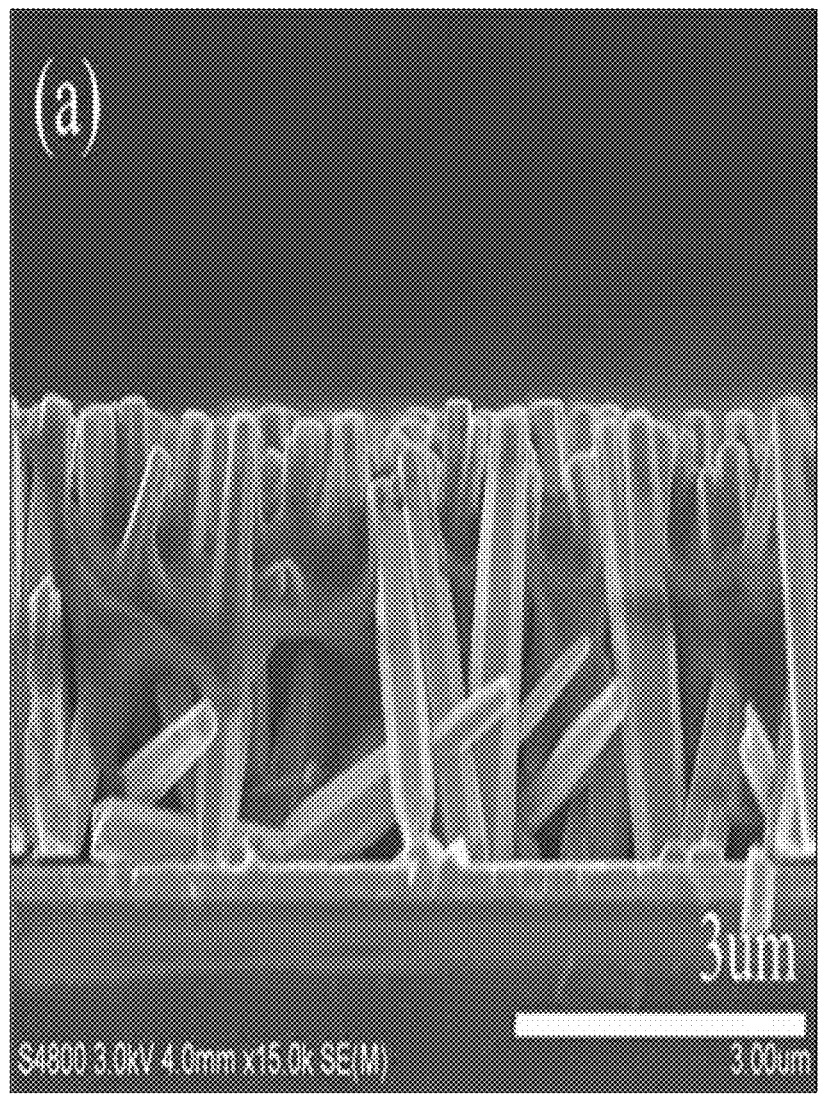
FIG. 2A demonstrates an SEM photo that shows inorganic nanocolumns embedded by an organic material in accordance with the present invention.

The invention disclosed herein is directed to a nanostructure composite material and a method for manufacturing the nanostructure composite material. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Referring now to FIG. 1, a schematic view of a preferred method for manufacturing a nanostructure composite material in accordance with the present invention is shown. In this embodiment, the method for manufacturing a nanostructure composite material S100 includes Step S110~Step S120 as follows.

In Step S110, an inorganic nanostructure is prepared. In this embodiment, the inorganic nanostructure is a Zinc oxide nanostructure. To prepare the inorganic nanostructure, following steps are included. Firstly, a Zinc oxide (ZnO) seed solution is prepared. In details, a Zinc acetate, a diethylene glycol and a deionized water are mixed to form a mixture. The mixture is then stirred and heated to form a base solution. Then, the base solution is process by a centrifugal manner so as to obtain a suspension solution from an upper layer of the base solution. The suspension solution is the Zinc oxide (ZnO) seed solution. In this embodiment, a centrifugal machine can be applied to process the base solution centrifugally. In a further embodiment, the inorganic nanostructure may include narrow band gap $0.15<Eg<0.6$ thermoelectric materials such as PbTe, PbSnTe, PbAgTe, etc.

After the Zinc oxide (ZnO) seed solution is prepared, then the Zinc oxide (ZnO) seed solution is coated onto a substrate so as to form a Zinc oxide (ZnO) seed layer. In the present invention, the substrate can be a glass substrate, or a substrate made of a crystal material, an a-Silicon material, a poly-Silicon material or a sapphire material. Then, the Zinc oxide (ZnO) seed layer is placed into a growth liquid so as to grow the Zinc oxide (ZnO) seed layer to corresponding Zinc oxide nanostructures. In this embodiment, the growth liquid is prepared at least by mixing a Zinc nitrate, a hexamethy lenetetramie (HMT) and a deionized water. In addition, in the step of growing the Zinc oxide (ZnO) seed layer to the Zinc oxide nanostructures, the Zinc oxide (ZnO) seed layer and the growth liquid are placed in an oven for undergoing a heating process. Till a growth time is over, a cleaning process is performed by using the deionized water to clean and thus obtain the Zinc oxide nanostructure.

In this embodiment, Step S110 is performed to prepare the inorganic nanostructure, which includes a plurality of nanocolumns. In another embodiment, the inorganic nanostructure can include a plurality of nanotubes. In this another embodiment, a side of the nanostructure having the nanocolumns is dipped into a KCl solution, then a heating and etching process is undergone on this side to form the nanotubes. In a further embodiment, the inorganic nanostructure may include a plurality of nanoneedles, which are obtained by properly controlling the growth time and concentrations of involved solutions.

Figure 2B:
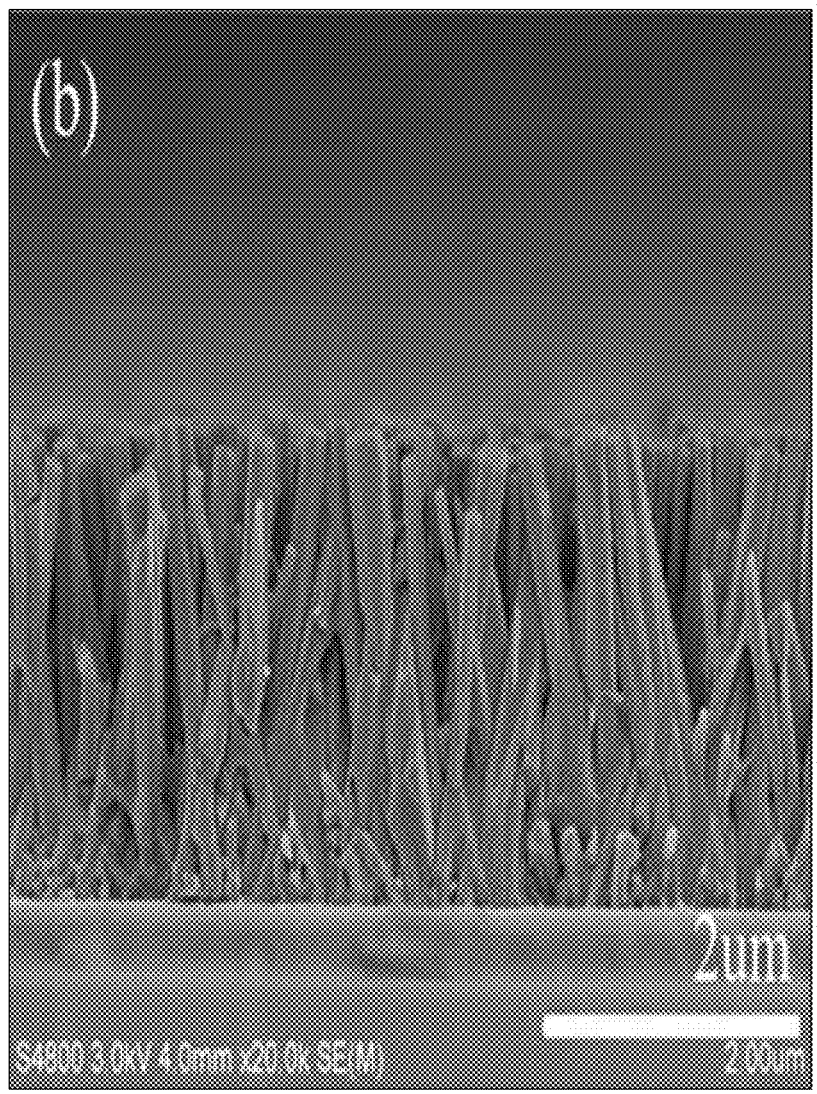
FIG. 2B demonstrates an SEM photo that shows inorganic nanotubes embedded by an organic material in accordance with the present invention.
Figure 2C:
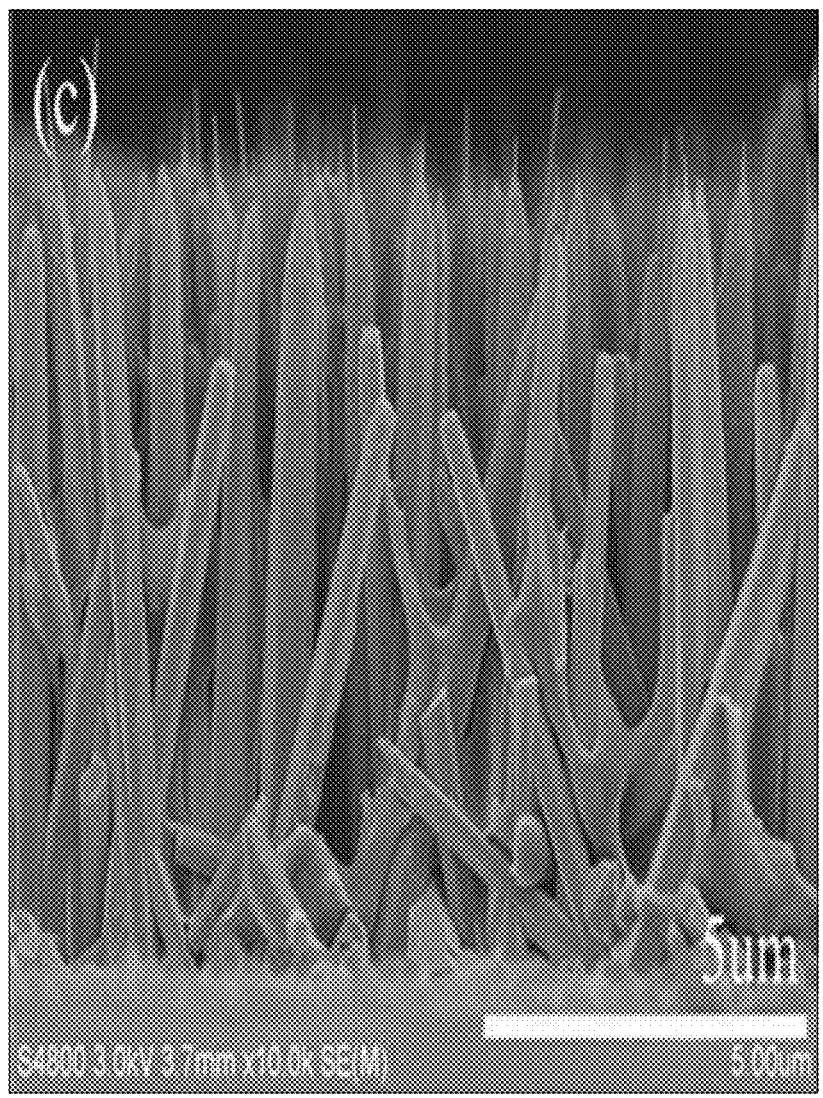
FIG. 2C demonstrates an SEM photo that shows inorganic nanoneedles embedded by an organic material in accordance with the present invention.

After the inorganic nanostructure is prepared in Step S110, Step S120 is executed to embed an organic material to the inorganic nanostructure so as to form a nanostructure composite material. In details, an organic mixture is obtained by mixing an organic compound and an organic solvent. In this embodiment, the organic compound is a poly(methyl methacrylate) (PMMA). Then, the inorganic nanostructure is placed into the organic mixture so as to have the organic mixture embedded to the inorganic nanostructure to further form the nanostructure composite material. Refer to FIG. 2A through FIG. 2C; where FIG. 2A demonstrates an SEM photo that shows inorganic nanocolumns embedded by an organic material in accordance with the present invention, FIG. 2B demonstrates an SEM photo that shows inorganic nanotubes embedded by an organic material in accordance with the present invention, and FIG. 2C demonstrates an SEM photo that shows inorganic nanoneedles embedded by an organic material in accordance with the present invention. In an experimental example, by raising the temperature of the inorganic nanostructure of nanocolumns embedded by the PMMA organic material to 600K, the thermoelectric figure of merit (ZT) is raised from 0.0101 to 0.12, i.e., a rise rate of 118.81%.

In summary, by providing the nanostructure composite material and the method for manufacturing the same in accordance with the present invention, the composite material includes an inorganic nanostructure and an organic material. The nanostructure composite material with both organic and inorganic properties is manufactured by embedding the organic material to the inorganic nanostructure in a form of nanocolumns, nanotubes or nanoneedles. By implementing a lower thermal conductivity contributed by the embedded organic material, the thermoelectric properties of the nanostructure composite material can thus be enhanced.

In addition, the nanostructure composite material of this present invention is not prepared by layered piling up, thus the entire volume of the nanostructure composite material can be reduced, such that a light and thin composite material can be obtained. Thereupon, the thermoelectric properties of the nanostructure composite material under a low-temperature (below 600K) application environment can ensured.

While the present invention has been particularly shown and described with reference to a preferred embodiment, it will be understood by those skilled in the art that various changes in form and detail may be without departing from the spirit and scope of the present invention.

What is claimed is:

1. A method for manufacturing a nanostructure composite material, comprising the steps of:
   preparing an inorganic nanostructure; and
   embedding an organic material to the inorganic nanostructure so as to form the nanostructure composite material,
   wherein the inorganic nanostructure is a Zinc oxide nanostructure, and the step of preparing the inorganic nanostructure includes the steps of:
   preparing a Zinc oxide (ZnO) seed solution;
   coating the Zinc oxide (ZnO) seed solution onto a substrate so as to form a Zinc oxide (ZnO) seed layer; and
   placing the Zinc oxide (ZnO) seed layer into a growth liquid so as to grow the Zinc oxide (ZnO) seed layer into the Zinc oxide nanostructure;

wherein the step of preparing the Zinc oxide (ZnO) seed solution includes the step of:
mixing a Zinc acetate, a diethylene glycol and a deionized water to form a mixture;
stirring and heating the mixture so as to form a base solution; and
processing the base solution in a centrifugal manner so as to obtain a suspension solution from an upper layer of the base solution, the suspension solution being the Zinc oxide (ZnO) seed solution.

2. The method for manufacturing a nanostructure composite material of claim 1, wherein the inorganic nanostructure includes a plurality of nanocolumns.

3. The method for manufacturing a nanostructure composite material of claim 1, wherein the inorganic nanostructure includes a plurality of nanotubes.

4. The method for manufacturing a nanostructure composite material of claim 1, wherein the inorganic nanostructure includes a plurality of nanoneedles.

5. The method for manufacturing a nanostructure composite material of claim 1, wherein the step of growing the Zinc oxide (ZnO) seed layer into the Zinc oxide nanostructure includes the steps of:
performing a heating process; and
performing a cleaning process.

6. The method for manufacturing a nanostructure composite material of claim 1, wherein the growth liquid is prepared by mixing a Zinc nitrate, a hexamethy lenetetramie (HMT) and a deionized water.

7. The method for manufacturing a nanostructure composite material of claim 1, wherein the step of embedding the organic material to the inorganic nanostructure includes the steps of:
mixing an organic compound and an organic solvent to form an organic mixture; and
placing the inorganic nanostructure into the organic mixture, so that the organic mixture is embedded to the inorganic nanostructure so as to form the nanostructure composite material.

* * * * *